United States Patent
Frahm et al.

(10) Patent No.: US 12,111,377 B2
(45) Date of Patent: Oct. 8, 2024

(54) METHOD AND DEVICE FOR ACQUIRING AND RECONSTRUCTING A SEQUENCE OF DIFFUSION-WEIGHTED MAGNETIC RESONANCE IMAGES COVERING A VOLUME

(71) Applicant: Max-Planck-Gesellschaft zur Foerderung der Wissenschaften e. V., Munich (DE)

(72) Inventors: Jens Frahm, Goettingen (DE); Dirk Voit, Goettingen (DE); Oleksandr Kalentev, Goettingen (DE)

(73) Assignee: Max-Planck-Gesellschaft zur Foerderung der Wissenschaften e. V., Munich (DE)

( * ) Notice: Subject to any disclaimer, the term of this patent is extended or adjusted under 35 U.S.C. 154(b) by 81 days.

(21) Appl. No.: 18/015,464

(22) PCT Filed: Jul. 31, 2020

(86) PCT No.: PCT/EP2020/071673
§ 371 (c)(1),
(2) Date: Jan. 10, 2023

(87) PCT Pub. No.: WO2022/022836
PCT Pub. Date: Feb. 3, 2022

(65) Prior Publication Data
US 2023/0280431 A1  Sep. 7, 2023

(51) Int. Cl.
*G01R 33/563* (2006.01)
*G01R 33/48* (2006.01)
(Continued)

(52) U.S. Cl.
CPC ... *G01R 33/56341* (2013.01); *G01R 33/4824* (2013.01); *G01R 33/5608* (2013.01);
(Continued)

(58) Field of Classification Search
CPC .......... G01R 33/56341; G01R 33/4824; G01R 33/5608; G01R 33/4835; G01R 33/5611;
(Continued)

(56) References Cited

U.S. PATENT DOCUMENTS

| 4,748,409 A | 5/1988 | Frahm et al. |
| 7,917,190 B2 | 3/2011 | Mistretta et al. |

(Continued)

FOREIGN PATENT DOCUMENTS

| JP | 2009-508656 A | 3/2009 |
| JP | 2013-521955 A | 6/2013 |

(Continued)

OTHER PUBLICATIONS

Bakushinsky et al. (2005). Iterative methods for approximate solution of inverse problems. Springer, Dordrecht, The Netherlands.
(Continued)

*Primary Examiner* — G.M. A. Hyder
(74) *Attorney, Agent, or Firm* — CAESAR RIVISE, PC (57) ABSTRACT

A method for creating multiple sequences of diffusion-weighted magnetic resonance (MR) images of an object is described, wherein each of said sequences of MR images represents the same series of contiguous cross-sectional slices covering a volume of the object. The method comprises (a) providing multiple sequences of sets of image raw data being collected with the use of at least one radiofrequency receiver coil of a magnetic resonance imaging device, wherein each set of image raw data includes data samples being generated with a combined diffusion-weighted spin-echo and single-shot stimulated-echo sequence with diffusion-encoding gradients, (b) subjecting a sequence of sets of image raw data generated with diffusion-encoding gradients of zero strength or lower strength to a regularized nonlinear inverse reconstruction process to pro-
(Continued)

vide a sequence of coil sensitivities and MR images with no or lower diffusion weighting, and (c) subjecting all sequences of sets of image raw data with diffusion-encoding gradients of zero or lower strength as well as of higher strength to a regularized linear inverse reconstruction process, to provide a sequence of MR images with no or lower diffusion weighting and a sequence of MR images with higher strength, each of the MR images representing one of the cross-sectional slices and being created by using the sensitivity of the at least one receiver coil determined in step (b) for the same cross-sectional slice and in dependency on a difference between a current image content estimation and an image content estimation of a neighboring cross-sectional slice. Furthermore, an MRI device for creating a sequence of diffusion-weighted MR images of an object is described.

11 Claims, 4 Drawing Sheets

(51) Int. Cl.
    *G01R 33/56*     (2006.01)
    *G06T 5/20*     (2006.01)
    *G06T 5/77*     (2024.01)
    *G06T 11/00*     (2006.01)

(52) U.S. Cl.
    CPC .............. *G06T 5/20* (2013.01); *G06T 5/77* (2024.01); *G06T 11/008* (2013.01); *G06T 2207/10088* (2013.01)

(58) Field of Classification Search
    CPC . G06T 5/20; G06T 5/77; G06T 11/008; G06T 2207/10088
    See application file for complete search history.

(56) References Cited

U.S. PATENT DOCUMENTS

| | | |
|---|---|---|
| 8,384,383 B2 | 2/2013 | Frahm et al. |
| 10,732,245 B2 | 8/2020 | Noguchi et al. |
| 2013/0119983 A1 | 5/2013 | Zenge |
| 2023/0243910 A1* | 8/2023 | Frahm ............... G01R 33/5608 324/309 |

FOREIGN PATENT DOCUMENTS

| | | |
|---|---|---|
| JP | 2017-209329 A | 11/2017 |
| WO | 2011116785 A1 | 9/2011 |

OTHER PUBLICATIONS

Baliyan et al. (2016). Diffusion weighted imaging: technique and applications. World J Radiol, 8(9), 785-798.
Frahm et al. (1985). Rapid NMR imaging using stimulated echoes. Journal of Magnetic Resonance, 65, 130-135.
Frahm et al. (2014). On the temporal fidelity of nonlinear inverse reconstructions for real-time MRI—the motion challenge. The Open Medical Imaging Journal, 8, 1-7.
Hirata et al. (2018). Comparison of the image quality of turbo spin echo- and echo-planar diffusion-weighted images of the oral cavity. Medicine, 97(19).
Khalil et al. (2016). Sensitivity of diffusion-weighted STEAM MRI and EPI-DWI to infratentorial ischemic stroke. PLOS One.
Merboldt et al. (1992). Diffusion imaging of the human brain in Vivo using high-speed STEAM MRI. Magnetic Resonance in Medicine, 23, 179-192.
Merrem et al. (2017). Rapid diffusion-weighted magnetic resonance imaging of the brain without susceptibility artifacts: Single-shot STEAM with radial undersampling and iterative reconstruction. Investigative Radiology, 52(7), 428-433.
Merrem. (2018). Dissertation, Undersampled radial STEAM MRI methodological developments and applications. Georg-August-University of Goettingen, 1-112.
Merrem et al. (2019). Diffusion-weighted MRI of the prostate without susceptibility artifacts: Undersampled multi-shot turbo-STEAM with rotated radial trajectories. NMR in Biomedicine, 32.
Nolte et al. (2000). Rapid isotropic diffusion mapping without susceptibility artifacts: whole brain studies using diffusion-weighted single-shot STEAM MR imaging. Magnetic Resonance in Medicine, 44, 731-736.
Schouten et al. (2014). Diffusion-weighted EPI- and HASTE-MRI and 18F-FDG-PET-CT early during chemoradiotherapy in advanced head and neck cancer. Quant Imaging Med Surg, 4(4), 239-250.
Jecker et al. (2010). Real-time MRI at a resolution of 20 ms. NMR Biomedicine, 23, 986-994.
Voit et al. (2021). Diffusion-weighted magnetic resonance imaging (MRI) without susceptibility artifacts: single-shot stimulated echo acquisition mode (STEAM) MRI with iterative reconstruction and spatial regularization. Quantitative Imaging in Medicine And Surgery, 11(2), 831-837.
International Search Report for PCT/EP2020/071673 dated Mar. 26, 2021.
Japanese Office Action dated Apr. 9, 2024.

* cited by examiner

METHOD AND DEVICE FOR ACQUIRING AND RECONSTRUCTING A SEQUENCE OF DIFFUSION-WEIGHTED MAGNETIC RESONANCE IMAGES COVERING A VOLUME

CROSS-REFERENCE TO RELATED APPLICATIONS

This application is a U.S. National Phase Application of PCT/EP2020/071673, filed Jul. 31, 2020, the content of which is incorporated herein by reference in its entirety for all purposes.

FIELD OF THE INVENTION

The present invention relates to a method for creating, in particular for acquiring and reconstructing, a sequence of magnetic resonance (MR) images with diffusion contrast, wherein the MR images cover a volume of directly neighbouring cross-sections and provide insensitivity to magnetic field inhomogeneity and improved image quality. Furthermore, the invention relates to a magnetic resonance imaging (MRI) device configured for implementing the method. Applications of the invention cover the field of MR imaging, in particular medical MR imaging (e.g., brain imaging or prostate imaging) or non-medical investigations in natural sciences (e.g., investigations of a workpiece).

BACKGROUND OF THE INVENTION

In the present specification, reference is made to the following prior art illustrating the technical background of the invention, in particular relating to acquisition and reconstruction of MR images:

[1] V. Baliyan et al. in "World J Radiol" 8:785-798, 2016;
[2] C. S. Schouten et al. in "Quant Imaging Med Surg" 4:239-250, 2014;
[3] K. Hirata et al. in "Medicine" 97:19(e0447), 2018;
[4] U.S. Pat. No. 4,748,409 A (J. Frahm et al.);
[5] J. Frahm et al. in "J Magn Reson" 65:130-135, 1985;
[6] K. D. Merboldt et al. in "Magn Reson Med" 23:179-192, 1992;
[7] U. G. Nolte et al. in "Magn Reson Med" 44:731-736, 2000;
[8] A. A. Khalil et al. in "PLoS ONE" 11:e0161416, 2016;
[9] A. B. Bakushinsky and M. Y. Kokurin "Iterative Methods for Approximate Solution of Inverse Problems" Springer, Dordrecht, The Netherlands, 2005;
[10] A. Merrem et al. in "Invest Radiol" 52:428-433, 2017;
[11] A. Merrem, Dissertation "Undersampled Radial STEAM MRI Methodological Developments and Applications", Georg-August-University of Goettingen, 2018;
[12] A. Merrem et al. in "NMR Biomed" 32, doi: 10.1002/nbm.4074, 2019;
[13] U.S. Pat. No. 8,384,383 B2 (J. Frahm et al.);
[14] M. Uecker et al. in "NMR Biomed" 23:986-994, 2010; and
[15] J. Frahm et al. in "The Open Med Imaging" J 8:1-7, 2014.

Diffusion-weighted (DW) magnetic resonance imaging (MRI) is known as an MRI method providing information about dynamic molecular processes such as self-diffusion and/or transport of water molecules by altering the signal strength of MR images. The technique is of high clinical relevance because diffusion characteristics differ between normal and pathologic tissue and thus result in diagnostically relevant contrast, e.g. between normal and ischemic brain tissue (i.e., stroke) or between normal and tumorous tissue (i.e. cancer).

Diffusion encoding of the MRI signal is commonly accomplished by a DW spin-echo sequence which comprises two radiofrequency pulses and a self-compensating set of strong magnetic field gradients. A spin-echo sequence typically comprises an initial excitation radiofrequency pulse, a first interval with a duration of half the spin-echo time TE/2, a refocusing radiofrequency pulse, and another interval TE/2 before formation of the spin echo at time TE (relative to the center of the initial excitation pulse). For diffusion encoding, the spin-echo sequence is typically complemented by a pair of identical magnetic field gradients with one gradient applied in each of the two spin-echo intervals. These gradients may be of a unipolar or bipolar nature, but also more complex gradient waveforms are possible. In the absence of motion, i.e. without any spatial displacement of the water molecules, the nuclear spin moments of water protons completely refocus in the spin-echo signal and therefore provide a maximum spin-echo signal strength which is only attenuated by T2 relaxation. In the presence of molecular diffusion or transport, however, the spin-echo signal is further reduced because a complete refocusing of spin moments is precluded when excited water protons move to positions with different magnetic field strengths, or more precisely, when water protons move between the application of the encoding diffusion gradient in the first spin-echo interval and the application of the identical refocusing diffusion gradient in the second spin-echo interval. The relevant "diffusion time" is the duration between (the center of) these each other compensating gradients in the first and second interval of the spin-echo sequence.

Because the positional displacement due to a molecular transport process is on a microscopic scale and thus very small, DW MRI usually employs very strong diffusion-encoding gradients in order to ensure sufficient contrast (i.e., signal intensity difference) between a DW image and a non-DW image (i.e., an image acquisition without diffusion-encoding gradients but otherwise identical conditions). Such images with different diffusion weightings serve to calculate quantitative maps of relevant diffusion characteristics, e.g. of the apparent diffusion coefficient (ADC).

At the same time, however, strong magnetic field gradients render available DW MRI techniques very sensitive to (macroscopic) movements. For example, in medical imaging this problem refers to involuntary body motions as well as movements due to respiration, cardiac pulsation or peristalsis. It is therefore standard practice to combine a diffusion-encoding spin-echo sequence with a high-speed (preferably single-shot) readout MRI sequence which results in a DW image that effectively "freezes" the actual condition, i.e. an image without motion-induced artefacts. In the past decades, several technical proposals have been made with respect to this strategy.

A preferred solution to overcome the motion sensitivity of DW MRI is the use of an echo-planar imaging (EPI) readout, as described in the recent review [1]. Today, DW EPI is the only commercially available method for DW MRI. It is generally (if not exclusively) used for medical MR imaging and widely accepted for clinical applications—despite some severe problems. The key disadvantage of DW EPI is as follows: As a gradient-echo MRI technique which relies on the application of a single radiofrequency excitation pulse and the acquisition of multiple gradient echoes with necessarily increasing echo times, EPI suffers from a pronounced sensitivity to magnetic field inhomogeneity. For example, in the human body, such field distortions are caused by unavoidable differences in the magnetic susceptibilities of different tissues. They lead to often severe geometric distortions as well as false positive or negative signal alterations in EPI images and compromise the diagnostic accuracy. For example, inhomogeneity effects occur in lower and frontal parts of the brain (i.e., close to air-filled cavities or dental implants) and even more frequently throughout the body such as for MRI of the prostate (i.e., close to the air-filled rectum). Nevertheless, in a clinical context, DW EPI is currently the only method of choice because the images present with good signal-to-noise ratio (SNR).

An alternative solution for DW MRI which avoids sensitivity to magnetic field inhomogeneity and still allows for high-speed acquisitions is the use of a single-shot spin-echo MRI sequence (see e. g. [2] and [3]). This technique uses multiple radiofrequency-refocused spin echoes (rather than gradient echoes as for EPI) in order to generate and spatially encode multiple spin-echo signals for image reconstruction. A severe disadvantage of this approach, however, is the need for many high-power radiofrequency excitations (i.e., refocusing pulses with high flip angles) which commonly leads to a violation of the specific absorption rate (SAR) limit for energy deposition within the human body. As a consequence, such single-shot spin-echo methods are not in general use for human applications.

An even further proposal for single-shot DW MRI is a combination of the DW spin-echo sequence with a readout sequence which comprises a series of radiofrequency-refocused stimulated echoes. A single-shot STEAM (stimulated echo acquisition mode) MRI sequence has been described as early as 1984 (see e. g. [4] and [5]). In this case, multiple stimulated echoes are generated by radiofrequency pulses with low flip angles which avoid any SAR problem. More recently, several versions for DW single-shot STEAM MRI have been developed which solve the susceptibility problem of DW EPI, but have the disadvantage of a lower SNR than DW EPI (see [6], [7] and [8]). As a consequence, DW STEAM MRI has not yet found clinical acceptance.

In order to overcome the SNR deficiency of DW STEAM MRI for specific applications to the brain, it has been proposed to combine the technique with an undersampled radial acquisition mode and to accomplish the image reconstruction as a two-step procedure which first determines coil sensitivities for a non-DW sequence of sets of image raw data by nonlinear inversion with regularization to the coil sensitivities of a neighbouring cross-section. The joint reconstruction of the non-DW images and their coil sensitivities is solved by the iteratively regularized Gauss-Newton method, as described e. g. in the textbook [9]. In a second step all non-DW images and DW images were reconstructed by linear inversion using the coil sensitivities of the non-DW images without any further spatial regularization ([10], [11]). Unfortunately, coil sensitivities offer only very low spatial frequency information, so that reconstructions with weak regularization fail to significantly improve the aforementioned problem and may even lead to numerical instabilities.

Another preceding version of DW STEAM MRI, which has been developed for specific application to the prostate ([12]), employs a multi-shot acquisition method. Apart from again using weak regularization with neighbouring coil sensitivities only (or even no spatial regularization), the approach requires a much more complex mathematical treatment in order to accomplish a joint reconstruction of DW images from multiple acquisitions which refer to different states of macroscopic movement.

An extremely accelerated method for acquiring and reconstructing a sequence of dynamic non-DW MR images using a regularization with a preceding image and all its coil sensitivities described in [9] has been proposed in [13] and [14]. The use of a gradient-echo MRI sequence with pronounced undersampling, non-Cartesian trajectories for spatial encoding, and image reconstruction by regularized nonlinear inversion results in acquisition times in the range of tens of milliseconds. Thus, depending on the dynamic process to be studied, temporal changes of the object under investigation can be monitored in real-time with high temporal fidelity ([15]). However, the technique of [13] and [14] is mainly directed to collect images of a single slice of the object, so that neither coverage of a volume of an object under investigation nor diffusion weighting is obtained. Although collecting images of different slices of the object is considered in [13] and [14] as well, this is limited to a few slices, like e. g. less than 5 slices. Furthermore, the corresponding applications are realized as interleaved multi-slice data acquisitions, so that the technique of [13] and [14] sacrifices temporal resolution and increases the sensitivity to motion.

OBJECTIVE OF THE INVENTION

The objective of the invention is to provide an improved method for creating, in particular acquiring image raw data and reconstructing, a sequence of DW MR images, which cover a volume of an object under investigation, said method being capable of overcoming disadvantages of conventional techniques and/or allowing new applications of MR imaging. In particular, the objective of the invention is to provide an improved method for creating a sequence of cross-sectional DW MR images for gap-free volume coverage with increased acquisition speed, reduced (or without) sensitivity to motion, improved SNR and/or reduced (or even without) sensitivity to magnetic field inhomogeneity. For medical imaging purposes, in particular, the objective is to provide a method for creating a sequence of DW MR images which cover a volume of a human body without gaps, with reduced (or without) sensitivity to motion and with reduced (or without) sensitivity to magnetic field inhomogeneity, thus allowing for a method for medical MR imaging applicable to the entire human body or portions thereof. Furthermore, the objective of the invention is to provide an improved MRI device, in particular being adapted for conducting the method for the acquisition and reconstruction of a spatially contiguous sequence of diffusion-weighted MR images of a volume.

SUMMARY OF THE INVENTION

The above objectives are solved by an MR image creating method and/or an MRI device of the invention.

According to a first general aspect of the invention, the above objective is solved by a method for creating sequences of diffusion-weighted MR images of an object under investigation, in particular acquiring image raw data and reconstructing the diffusion-weighted MR images, wherein each of said sequences of MR images represents the same series of contiguous cross-sectional slices covering a volume of the object.

The inventive method comprises a step of providing multiple sequences of sets of image raw data being collected with the use of at least one radiofrequency receiver coil of a magnetic resonance imaging (MRI) device.

Each set of image raw data includes an image content of one of the MR images to be reconstructed, and each set of image raw data refers to one of the cross-sectional slices, i.e. each of the MR images to be reconstructed represents one of the cross-sectional slices. The cross-sectional slices provide a series of directly neighbouring cross-sections covering the volume of the object. The position of each cross-sectional slice is shifted by a slice shift in a direction perpendicular to the imaging plane in order to cover the volume of the object under investigation. The slice shift is equal to a predetermined slice thickness of the cross-sectional slices. Providing the image raw data of directly neighbouring cross-sections means that the image raw data are provided without or with negligible overlap of image content of the neighbouring cross-sections and without or with negligible gaps between image content of the neighbouring cross-sections. The spatial orientation of the imaging plane, e. g. relative to a longitudinal z direction of the main magnetic field of the MRI device, can be selected in dependency on an imaging task, e. g. in dependency on the anatomical orientation of an organ to be imaged in a human body. The spatial orientation of the imaging plane can be set by directions of the spatially encoding magnetic field gradients in the MRI device.

Furthermore, each set of image raw data includes a plurality of data samples being generated with a combined diffusion-weighted spin-echo and single-shot stimulated-echo sequence with diffusion-encoding gradients (indicated in the following as DW single-shot STEAM sequence). The DW single-shot STEAM sequence spatially encodes an MRI signal (i. e. set of image raw data) received with the at least one radiofrequency receiver coil using a non-Cartesian, preferably radial, k-space trajectory.

The diffusion-encoding gradients of said multiple sequences of sets of image raw data have at least two different strengths and at least three different directions. Accordingly, each sequence of sets of image raw data is distinguished by a predetermined diffusion-encoding gradient strength (gradient amplitude, which may be zero) and a predetermined diffusion-encoding gradient direction, wherein at least two different sequences of sets of image raw data use different diffusion-encoding gradient strengths and at least three different sequences of sets of image raw data use different diffusion-encoding gradient directions.

At least one of the sequences of sets of raw data is generated with diffusion-encoding gradients of zero strength or lower strength. This sequence, which also can be indicated as "zero or lower strength sequence", is generated without a diffusion-encoding gradient or with a diffusion-encoding gradient strength lower than the diffusion-encoding gradient strengths of the remaining sequences of sets of image raw data. The at least one zero or lower strength sequence is collected with the lowest of all applied diffusion-encoding gradient strengths or without diffusion-encoding gradient.

Further sequences of sets of raw data are generated with diffusion-encoding gradients of higher strength. These sequences, which also can be indicated as "higher strength sequences", are generated with diffusion-encoding gradient strengths above zero and higher than the diffusion-encoding gradient strength of the zero or lower strength sequence.

Optionally, the sequences of sets of image raw data can be repeatedly acquired for advantageously obtaining a noise reduction, i. e. the sequences of sets of image raw data may include further sequences of image raw data with equal strength or direction. Accordingly, with this preferred variant, the zero or lower strength sequence and/or at least one of the higher strength sequences can be repeatedly collected.

Each set of image raw data comprises a set of homogeneously distributed lines in k-space with equivalent spatial frequency content, wherein the lines of each set of image raw data cross the center of k-space and cover a continuous range of spatial frequencies and the number of lines of each set of image raw data is selected such that each set of image raw data is undersampled below a sampling rate limit defined by the Nyquist-Shannon sampling theorem (also known as Whittaker-Kotelnikow-Shannon sampling theorem). Employing an undersampled radial trajectory for spatial encoding advantageously provides image raw data collected with high acquisition speed. The positions of the lines of each set of image raw data differ in sets of image raw data from neighbouring cross-sectional slices.

Furthermore, the inventive method comprises a step (first reconstructing step) of subjecting a sequence of sets of image raw data generated with diffusion-encoding gradients of zero strength or lower strength, i. e. the zero or lower strength sequence, to a regularized nonlinear inverse reconstruction process to provide a sequence of coil sensitivities and MR images with no or lower diffusion weighting (compared with the remaining MR images). Each of the coil sensitivities and MR images represents one of the cross-sectional slices and each of the coil sensitivities and MR images is created by a simultaneous estimation of a sensitivity of the at least one receiver coil and the image content and in dependency on a difference between a current estimation of the sensitivity of the at least one receiver coil and the image content and an estimation of the sensitivity of the at least one receiver coil and the image content of a neighbouring cross-sectional slice.

Furthermore, the inventive method comprises a step (second reconstructing step) of subjecting all sequences of sets of image raw data with diffusion-encoding gradients of zero or lower strength as well as of higher strength, i. e. all collected sequences of sets of image raw data, to a regularized linear inverse reconstruction process, to provide at least one sequence of MR images with no or lower diffusion weighting and at least one sequence of MR images with higher strength, each of the MR images representing one of the cross-sectional slices and being created by using the sensitivity of the at least one receiver coil determined in the first reconstructing step for the same cross-sectional slice and in dependency on a difference between a current estimation of the image content and an estimation of the image content of a neighboring cross-sectional slice. Preferably, at least three sequences of MR images with higher strength are provided for obtaining DW images at least for three orthogonal directions in space.

Advantageously, in contrast to [10] and [11], all non-DW and DW images are obtained as the solution to a linear inverse problem with full spatial regularization. In particular, in the first reconstructing step the present invention extends the regularization of the nonlinear inverse problem to both a directly neighbouring image (with low and high spatial frequency components) and all its associated coil sensitivities. Moreover, the linear inverse problem in the second reconstruction step involves regularization to a directly neighbouring image, while using the coil sensitivities determined in the first reconstructing step. The resulting reconstructions allow for a higher degree of data undersampling and therefore acquisition speed. They further achieve computational robustness as well as high spatial fidelity and increased quality of each cross-sectional image.

In fact, the numerical solutions in the first and second reconstructing steps formally adopt a similar regularization as originally developed for dynamic real-time MRI ([13] and [14]), but now in space rather than in time. In other words, the invention exploits the similarity of successive, i.e. directly neighbouring images (first and second step) and coil sensitivities (first step), and therefore achieves a similar degree of spatial fidelity as previously demonstrated for temporal fidelity when using temporal regularization by a preceding image and its coil sensitivities ([15]).

In other words, the nonlinear inverse reconstruction process is an iterative process which in each iterative step solves a regularized linearization of a nonlinear MRI signal equation which maps the unknown spin density to be measured and its coil sensitivities to the data acquired from the at least one receiver coil. Similarly, the linear inverse reconstruction process is an iterative process which in each iterative step solves a regularized linear MRI signal equation which maps the unknown spin density to be measured to the data acquired from the at least one receiver coil, while using the coil sensitivities determined in the nonlinear reconstruction process. In both cases the nonlinear and linear inverse reconstructions are preferably accomplished with use of the iteratively regularized Gauss-Newton method. The inventors have found that inverse reconstruction processes employing the similarity of temporally successive images of a given image plane as described in [13] and [14] can be used for reconstructing spatially successive images of the contiguous cross-sectional slices, i. e. images of different imaging planes. This is a surprising result as it was not expected before the invention that adjacent cross-sectional slices have sufficient similarity for successfully applying a regularized inverse reconstruction process, even with objects having step-wise changes of the spin density therein. Contrary to [13] and [14], the inventive method primarily does not provide a sequence of temporally changing (dynamic) MR images, but a sequence of spatially distributed (static) MR images of the object which furthermore have diffusion contrast.

In contrast to [11] and [12], the present invention relies on a DW single-shot STEAM MRI acquisition in conjunction with a linear inverse reconstruction of all images with regularization to a directly neighbouring image. The method according to the invention is therefore adapted for improving the spatial resolution as, compared to [11] and [12], higher spatial frequencies are introduced to both the non-linear and linear inversion in the first and second reconstructing step, respectively. Advantageously, the invention provides particular advantages for medical imaging, and it is directly applicable to different organ systems, in particular to both the human brain and prostate.

In summary, the invention provides a technique for DW single-shot STEAM MRI of a volume without susceptibility artefacts and with improved image quality compared to preceding methods. The invention acquires non-DW and DW datasets for a series of directly neighbouring cross-sections which cover a volume of an object under investigation without gaps. It determines optimal coil sensitivities by nonlinear inverse reconstruction of a non-DW dataset in the first reconstruction step, while the main reconstruction of all non-DW and DW images is accomplished as the solution to a linear inverse problem with spatial regularization to a neighbouring image. The invention offers (i) DW MRI of a volume without any sensitivity to magnetic field inhomogeneity and therefore avoids geometric distortions, signal void and false positive and negative signal alterations in contrast to DW EPI. In comparison to preceding DW STEAM MRI methods the invention further offers (ii) a higher degree of data undersampling and therefore reduced measuring times, (iii) improved computational stability, speed and spatial fidelity, (iv) improved spatial resolution and SNR, (v) general applicability to different organ systems, and (vi) in case of medical imaging, clinically feasible scan times.

According to a second general aspect of the invention, the above objective is solved by an MRI device being configured for creating a sequence of diffusion-weighted MR images of an object under investigation and comprising an MRI scanner and a control device. The MRI scanner includes a main magnetic field device, at least one radiofrequency excitation coil, three magnetic field gradient coils and at least one radiofrequency receiver coil. According to the invention, the control device, like a computer device, is adapted for controlling the MRI scanner for collecting the multiple sequences of sets of image raw data and reconstructing the sequences of MR images with the method according to the first aspect of the invention or one of the embodiments thereof.

According to a preferred embodiment of the invention, the method for creating sequences of DW MR images comprises a further step of subjecting said sequences of MR images to a calculation of quantitative maps of the object under investigation, comprising a pixelwise calculation of at least one of a mean diffusion-weighted MRI signal averaged across gradient directions, a representation of diffusion properties, in particular the diffusion tensor, a trace of the diffusion tensor, an apparent diffusion coefficient, a fractional anisotropy, and a representation of diffusion directions, in particular a main diffusion direction. The calculation of the quantitative maps has particular advantages for medical imaging as the quantitative maps provide a basis for separate successive diagnostics.

According to a further preferred embodiment of the invention, the reconstruction processes of at least one of the first and second reconstructing steps includes a filtering process suppressing image artefacts. Advantageously, filtering improves the image quality. With a particularly preferred variant, the filtering process includes applying a spatial filter, in particular a non-local means filter for each MR image.

As a further advantage of the invention, the image raw data can be selected with a high degree of undersampling, i.e. relative to a fully sampled reference which—e.g. for radial encoding with rotated straight lines and according to the sampling theorem—is given by $\pi/2$ times the number of data samples per line. The degree of undersampling can be at least a factor of 5, in particular at least a factor of 10, thus accelerating the data acquisition in the same manner as described for real-time MRI (e.g., see [14]). Accordingly, the number of lines of each set of image raw data can be reduced. In particular for medical imaging, it has been found that a number of lines of each set of image raw data equal or below 30, in particular equal or below 20 is sufficient for obtaining high quality MR image sequences.

According to a further preferred embodiment of the invention, the lines of each set of image raw data can be selected such that the lines of successive sets of image raw data are rotated relative to each other by a predetermined angular displacement. As an advantage, this rotation improves the effect of the regularization within the image reconstruction.

According to another preferred embodiment of the invention, the strength of the diffusion encoding gradients of zero or lower strength is equal to or below a b-value of 100 s $mm^{-2}$, in particular zero. With a diffusion encoding gradient strength below this limit, the coil sensitivities calculated with the first reconstructing step are exploited for the second reconstructing step in an advantageous manner with improved signal quality. As a further advantage, the resulting (sequences of) images with no or lower diffusion-weighting provide an improved reference for the combination with corresponding (sequences of) images with higher diffusion-weighting to calculate (sequences of) quantitative maps of a variety of diffusion characteristics such as the apparent diffusion coefficient which, e. g. in medical MR imaging, are of importance for diagnostic purposes.

Contrary to the diffusion encoding gradients of lower strength, the strengths of the diffusion encoding gradients of higher strength are preferably equal to or above a b-value of $b=200$ s $mm^{-2}$, in particular equal to or above a b-value of $b=800$ s $mm^{-2}$, and equal to or lower than $b=3000$ s $mm^{-2}$. For example, b-values of up to 1000 s $mm^{-2}$ are typically used for standard neuroimaging applications [1].

With a further preferred variant of the invention, the collection of each set of image raw data is preceded by a radiofrequency pulse and magnetic field gradient module for frequency-selective saturation. Advantageously, the frequency-selective saturation allows for achieving specific contrasts depending on the imaging task.

Advantageously, the inventive method for reconstructing a sequence of MR images can be conducted during and/or immediately after collecting the image raw data with the at least one radiofrequency receiver coil of the MRI device. In this case, providing the series of sets of image raw data comprises the steps of arranging the object in the MRI device including the at least one receiver coil, subjecting the object to the DW single-shot STEAM sequence, and collecting the series of sets of image raw data using the at least one receiver coil. Reconstructing the sequence of MR images can rapidly be completed after the end of the image raw data collection.

According to an alternative embodiment, the inventive method for reconstructing the sequence of MR images can be conducted independently of collecting the image raw data with predetermined measurement conditions. In this case, the sets of image raw data can be received, e.g. from a data storage, like in a data cloud storage, and/or a data transmission from a distant MRI device.

BRIEF DESCRIPTION OF THE DRAWINGS

Further details and advantages of the invention are described with reference to the attached drawings, which schematically show in FIG. 1: a combined diffusion-weighted spin-echo and single-shot stimulated-echo sequence with diffusion-encoding gradients used for raw data acquisition with preferred embodiments of the MR imaging method according to the invention.

DESCRIPTION OF THE PREFERRED EMBODIMENTS

Preferred embodiments of the invention are described in the following with particular reference to the data flow of the inventive raw data acquisition and reconstruction process, the basic components of an inventive MRI device and practical application examples.

The details of the design of k-space trajectories and the mathematical formulation and implementation of the inverse reconstructions are preferably provided as disclosed in [13] or [14]. In particular, the regularized nonlinear inverse reconstruction process is preferably implemented as disclosed in [13] for the reconstruction of time series of MR images of an object under investigation. Thus, [13] is incorporated to the present specification by reference in its entirety, in particular with regard to all details of image reconstruction of the sequence of cross-sectional MR images of the object under investigation in the first reconstructing step. All procedural steps applied to time series of sets of raw data and sequences of MR images in [13] can be applied in the same manner to slice sequences of sets of raw data generated with the zero or lower strength sequence. The implementation of the linear inverse reconstruction process in the second reconstructing step follows that of the nonlinear inverse reconstruction process but uses the coil sensitivities determined in the first reconstructing step. In both cases the numerical optimization is accomplished by the iteratively regularized Gauss-Newton method with spatial regularization to a neighbouring cross-section. The linear inverse reconstruction process is not restricted to applying the regularized Gauss-Newton method. Alternatively, other known numerical methods can be used for solving the inverse problem.

Further details of the MRI device, the numerical implementation of the mathematical formulation using available software tools and optional further image processing steps or calculating steps for providing quantitative maps are not described as far as they are known from conventional MRI techniques. Furthermore, exemplary reference is made in the following to parallel MR imaging wherein the image raw data comprise MRI signals received with a plurality of radiofrequency receiver coils. It is emphasized that the application of the invention is not restricted to parallel MR imaging, but rather possible even with the use of one single receiver coil.

Figure 1:
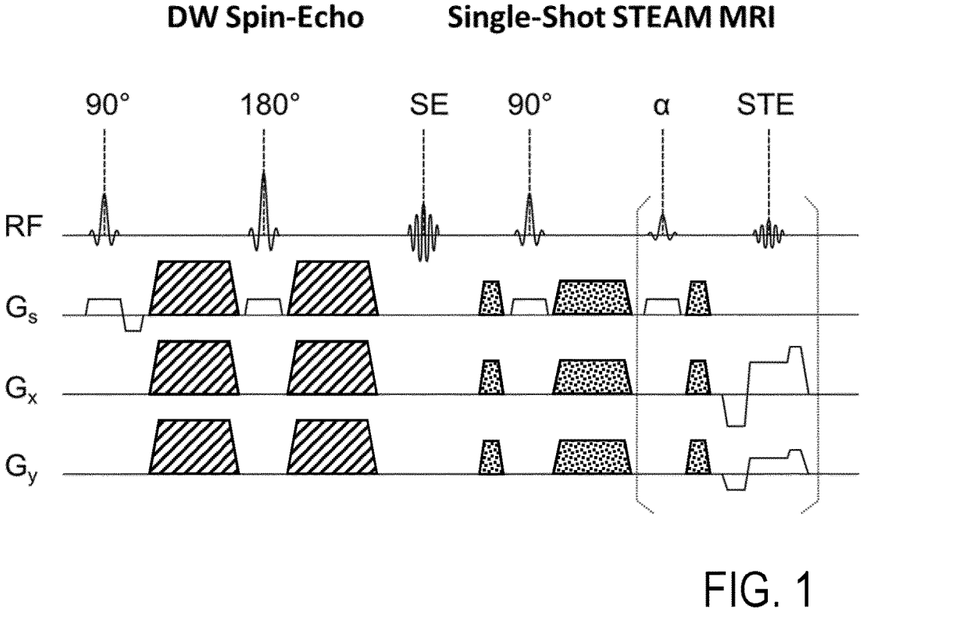
Figure 2:
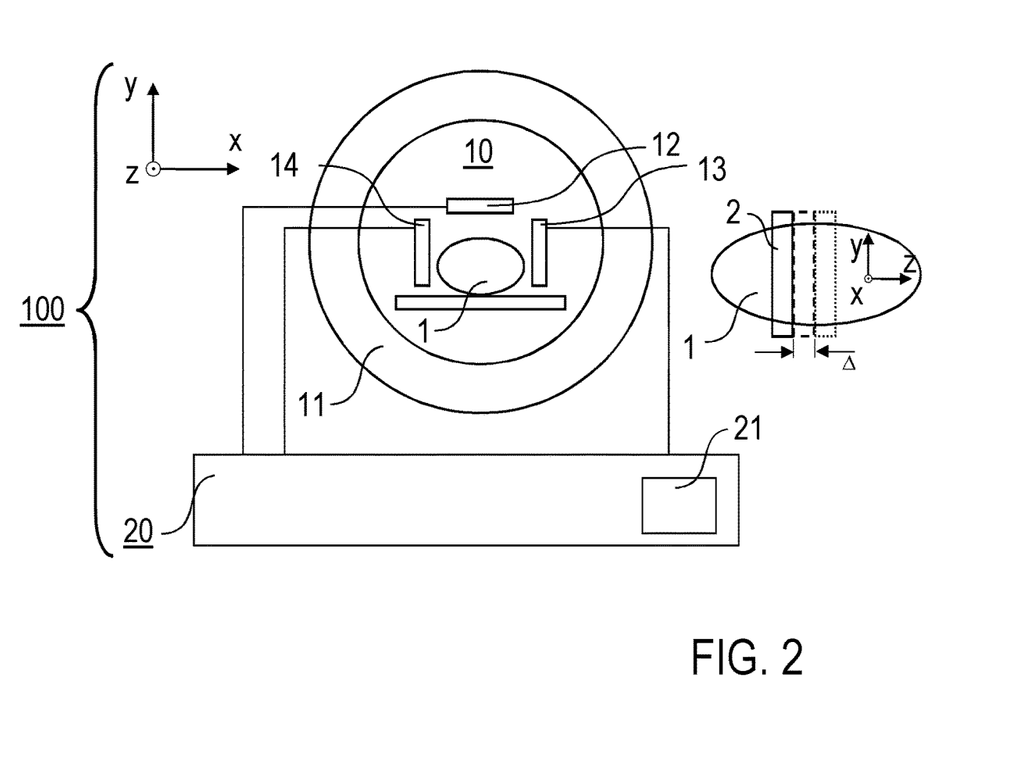
FIG. 2: a preferred embodiment of an MRI device according to the invention.
Figure 3:
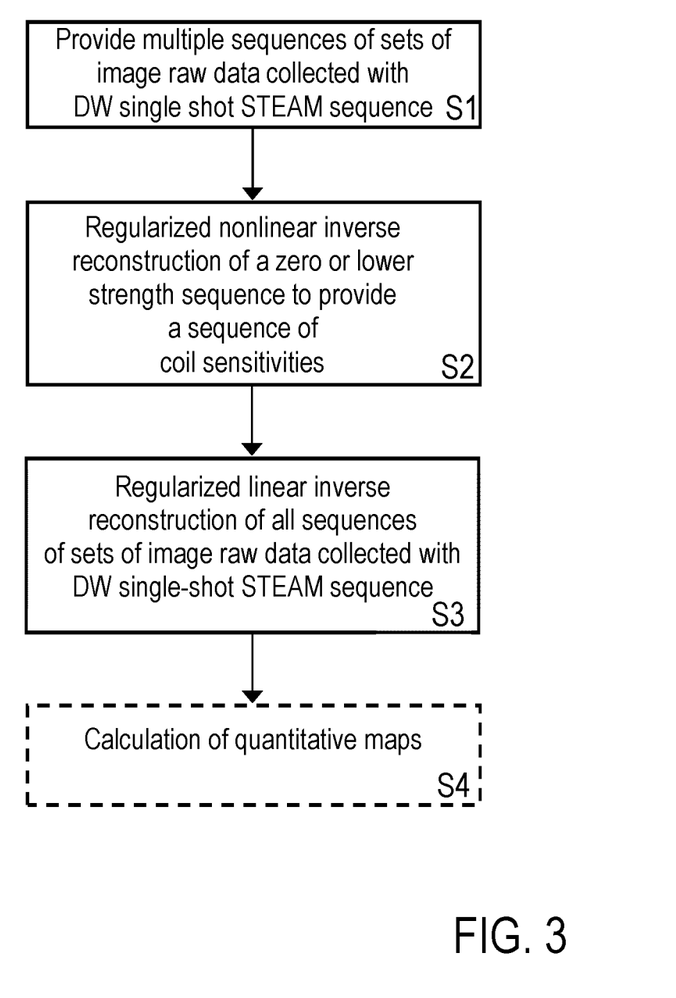
FIG. 3: a flowchart illustrating features of preferred embodiments of the MR imaging method according to the invention.
Figure 4:
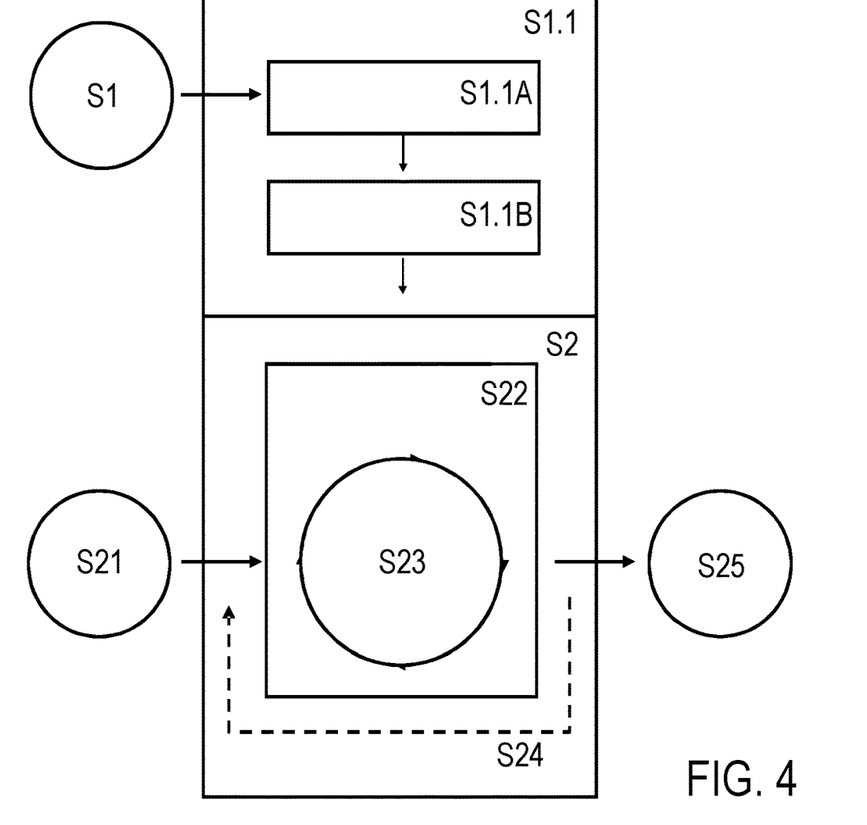
FIG. 4: a flowchart illustrating the first reconstructing step of the MR imaging method according to the invention.
Figure 5:
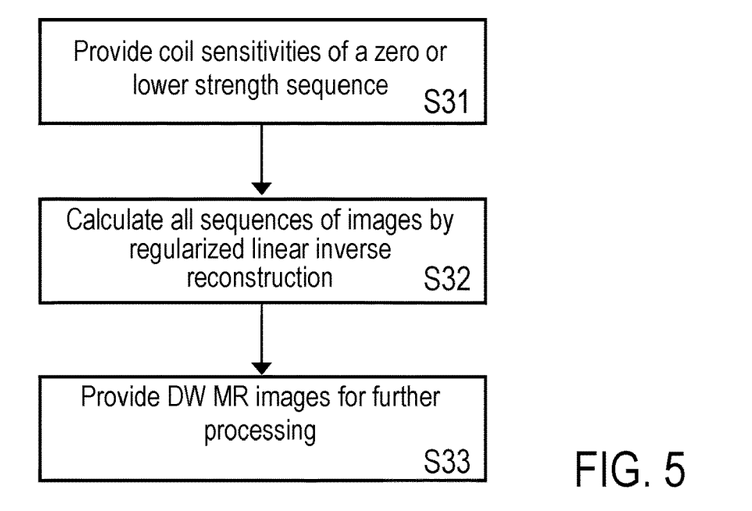
FIG. 5: a flowchart illustrating the second reconstructing step of the MR imaging method according to the invention.

FIG. 1 schematically shows an embodiment of a combined diffusion-weighted spin-echo and single-shot stimulated-echo sequence with diffusion-encoding gradients as applied and collected with an embodiment of an MRI device 100 as illustrated in FIG. 2. The MRI device 100 includes an MRI scanner 10 with a main magnetic field device 11, at least one radiofrequency excitation coil 12, three magnetic field gradient coils 13 and radiofrequency receiver coils 14. The main magnetic field device 11 creates a static main magnetic parallel to the longitudinal axis of the MR scanner bore, e. g. z-axis. The object 1 to be investigated is accommodated in the MRI device 100. Furthermore, the MRI device 100 includes a control device 20 being adapted for controlling the MRI scanner 10 for collecting the sequences of sets of image raw data and reconstructing the sequence of MR images with step S1 of the illustrated embodiment as shown in FIGS. 3 to 5. The control device 20 includes at least one GPU 21, which is preferably used for implementing the nonlinear and linear inversion algorithms sketched in FIGS. 4 and 5, respectively.

According to FIG. 3, the preferred embodiment of the inventive method includes the raw data acquisition step S1 of providing multiple sequences of sets of image raw data collected with the DW single-shot STEAM sequence, the first reconstructing step S2 of regularized nonlinear inverse reconstruction of a zero or lower strength sequence, the second reconstructing step S3 of a regularized linear inverse reconstruction of all sequences of non-DW and DW images, using the at least one coil sensitivity of a zero or lower strength sequence of the same cross-sectional slice, and a calculating step S4 of calculating quantitative maps.

Thus, one part of the inventive method includes the reconstruction of a sequence of cross-sectional STEAM MR images for a number of slices without or with lower diffusion-encoding gradients, wherein the STEAM MR images and associated coil sensitivities are obtained by the nonlinear inverse reconstruction process with regularization to a neighbouring image and its coil sensitivities (first reconstructing step S2). Another part of the inventive method includes the linear inverse reconstruction of all non-DW and DW STEAM MR images for the same slices with regularization to a neighbouring image (second reconstructing step S3). This step may be applied with as many different diffusion-encoding gradients of zero or lower or higher strength as required for a particular application (e.g., with gradients of different strength or different orientation or with similar strength for improving the SNR).

Raw Data Acquisition

For providing, in particular acquiring the raw data, a number of directly neighbouring slices 2 with constant slice thickness is defined in a volume of the object 1 under investigation, like an organ of a patient, as schematically shown in the insert of FIG. 2. The number and thickness of slices 2 is selected in dependency on the size of the organ, the slice thickness employed, the measuring time and/or the imaging resolution to be obtained. As a practical example of imaging a human brain about 50 slices with a slice thickness of 3 mm are defined. For each slice, varying DW single-shot STEAM sequences are applied as described in the following.

In the raw data acquisition step S1 of the inventive method, multiple sequences of sets of image raw data are provided which are collected with the DW single-shot STEAM sequence as shown in FIG. 1. Each sequence of sets of image raw data represents one of the slices. The object 1, e. g. a tissue or organ of a patient, is subjected to the DW single-shot STEAM sequence of FIG. 1 encoding the MRI signal received with the radiofrequency receiver coils 14. The section in brackets is repeated for each line in k-space. The DW single-shot STEAM sequence is constructed such that data samples are collected along non-Cartesian k-space trajectories. A slice shift A being equal to the slice thickness is accomplished by changing the radiofrequency excitation pulse.

Each DW single-shot STEAM MRI sequence of FIG. 1 combines a leading spin-echo sequence (with or without diffusion-encoding gradients) and a single-shot STEAM MRI readout sequence. The version sketched in FIG. 1 and used for obtaining the clinically relevant applications shown in FIGS. 6 and 7 refers to a preferred example with a pair of unipolar diffusion-encoding gradients (hatched) in a two-pulse spin-echo sequence (SE=spin echo) and radial encoding gradients ($G_x$, $G_y$) in the single-shot STEAM MRI sequence (STE=stimulated echoes, $G_s$=slice-selection gradient, RF=radiofrequency pulses, dotted=spoiler gradients). In general, different variants of the diffusion-encoding spin-echo module are possible which, for example, include more complex gradient waveforms or employ two or more refocusing pulses.

In the practical implementation of the invention, the DW single-shot STEAM sequence of FIG. 1 is applied a number n of times. As an example, one of the sequences of sets of raw data (the zero or lower strength sequence) is generated without diffusion-encoding gradients in the leading spin-echo sequence, while further sequences of sets of raw data are generated with diffusion-encoding gradients of higher strength. Implementations with a minimum number of n=4 repetitions represent applications with only one diffusion-encoding gradient of zero or lower strength and three diffusion-encoding gradients with higher strength and different directions. However, the number n may also correspond to several hundred repetitions, e.g. when using 128 gradient directions and multiple averages to allow for advanced post-processing applications such as fiber tractography.

To avoid ambiguities with directional differences of diffusion properties, clinical applications of DW MRI techniques usually measure DW images in at least 3, but preferably 6, directions with use of 3 or 6 differently oriented diffusion-encoding gradients, respectively. Such protocols are used for the calculation of a mean DW image averaged across diffusion-encoding directions in order to obtain an image with an "isotropic" (i.e., orientation-independent) diffusion weighting.

Moreover, clinical applications of DW MRI usually rely on two or more different gradient strengths (e.g., characterized by b values of 0 and 1000 s $mm^{-2}$). Together with DW images with multiple gradient directions, such information is used for the calculation of an orientation-independent mean DW image, a diffusion tensor, and a corresponding map of the ADC as well as of other diffusion characteristics (e.g., a fractional anisotropy map). With particular applications of DW MRI, more than two, e. g. up to 10, gradient strengths can be applied.

For increasing the SNR, the zero or lower strength sequence of sets of raw data and/or the higher strength sequences of sets of raw data can be repeatedly collected. The number of repetitions can be selected in dependency on the application conditions of the MRI method.

Image Reconstruction

First, a sequence of MR images with zero or lower diffusion weighting is obtained by a regularized nonlinear inverse reconstruction process (first reconstructing step S2 in FIG. 3) which jointly estimates each image and its associated coil sensitivities while exploiting the spatial similarity to a directly neighbouring image and its coil sensitivities (e.g., using the iteratively regularized Gauss-Newton method).

Deviating from [13], each set of the image raw data represents another one of contiguous cross-sectional slices 2 as shown in the schematic insert of FIG. 2.

FIG. 4 summarizes a data flow including the first reconstructing step S2, as described in [13] after the raw data acquisition step S1 of providing measured raw data and an optional pre-processing step S1.1 of pre-processing the measured data.

With pre-processing step S1.1, the image raw data are subjected to a gradient delay correction S1.1A, wherein possible unintended shifts of the k-space lines from the center of k-space are corrected, and to an interpolation step S1.1B, wherein an interpolation of the non-Cartesian data onto a Cartesian grid is conducted. Steps S1.1A and S1.1B can be implemented as disclosed in [13].

Subsequently, with the first reconstructing step S2, the sequence of coil sensitivities and MR images of the object 1 is reconstructed by the regularized nonlinear inverse reconstruction process, which is described in [13]. Starting from an initial guess S21 for the MR image of a first cross-sectional slice and the coil sensitivities, each of the MR images is created by an iterative simultaneous estimation S22 of sensitivities of the receiver coils and the image content. Step S22 comprises the nonlinear inverse reconstruction using an iteratively regularized Gauss-Newton method including a convolution-based conjugate gradient algorithm S23. The number of iterations (Newton steps) is selected in dependency on the image quality requirements of a particular imaging task. Finally, the reconstructed sequence of coil sensitivities is output for further processing in the second reconstruction step (S25).

As the result of step S2, a sequence of cross-sectional STEAM MR images and associated coil sensitivities, each representing one of slices 2 is obtained, wherein the STEAM MR images and associated coil sensitivities are generated without or with lower diffusion-encoding gradients. Preferably, for the further processing in step S3, only the coil sensitivities are used, while the MR images obtained in step S2 are discarded.

Subsequently, the second reconstructing step S3 of FIG. 3 is conducted as shown in FIG. 5. The complex coil sensitivities of the individual cross-sectional images are provided with step S31 as a result of the first reconstructing step S2. As illustrated with step S32 in FIG. 5, the coil sensitivities are used for the calculation of all sequences of STEAM MR images of the same cross-sections with arbitrary diffusion weightings by linear inversion with spatial regularization. The linear inverse reconstruction also employs the iteratively regularized Gauss-Newton method, while the number of iterations (Newton steps) is selected in dependency on the image quality requirements of a particular imaging task.

With step S32, each sequence of sets of image raw data with diffusion-encoding gradients of zero or lower strength and each sequence of sets of image raw data with diffusion-encoding gradients of higher strength is subjected to the regularized linear inverse reconstruction process. Processing the at least one sequence of sets of image raw data with diffusion-encoding gradients of zero or lower strength correspondingly results in at least one sequence of MR images with no or lower diffusion weighting. Furthermore, processing the at least one sequence of sets of image raw data with diffusion-encoding gradients of higher strength correspondingly results in at least one sequence of MR images with higher strength.

In other words, all sequences of MR images are calculated, regardless of their diffusion weighting, with linear inversion and regularization by the neighboring image (the sequences of coil sensitivities are fixed as already known from step S2 in FIG. 3). Each of the MR images in each sequence represents one of the cross-sectional slices. Each of the MR images is created by using the sensitivity of the at least one receiver coil for the same cross-sectional slice (linear inversion) and in dependency on a difference between a current estimation of the image content, i. e. a current set of image raw data, and an estimation of the image content of a neighboring cross-sectional slice, i. e. a preceding set of image raw data (regularization). As the result, the MR images to be obtained are provided with step S33 for further processing.

The nonlinear and linear inverse reconstructions of the first few images in the first and second reconstructing step S2 and S3, respectively, do not fully benefit from spatial regularization. In particular, for the inverse reconstruction of the first image of each sequence no prior information exists, i.e. no image from a neighbouring slice. The problem may be circumvented in multiple ways. First, the output and display of the first few (e.g., 5) images may be discarded. Secondly, the data acquisition may be extended to include a few additional slices outside the target volume to be covered. Or third, at the expense of reconstruction time, the reconstructions may be repeated in reverse order by initializing the reconstruction with the last image and its coil sensitivities from the initial reconstruction.

The zero or lower strength sequence and the higher strength sequences of sets of raw data may be repeatedly collected in step S1 for increasing the SNR. Multiple MR images with identical diffusion weighting can be averaged for further processing. Again, further steps of conventional processing, storing, displaying, or recording of image data can follow. Calculating further MR images with zero or lower or higher diffusion weighting has advantages for calculating the maps in step S4 (see below).

For medical imaging, the sequences of MR images obtained with the reconstruction step S3 are used for a calculation of quantitative maps of the object under investigation (step S4 in FIG. 3).

The calculation of the quantitative maps relates to a pixelwise calculation of a variety of diffusion properties such as e.g. a mean diffusion-weighted MRI signal averaged across gradient directions and the apparent diffusion coefficient. Step S4 is implemented as it is known as such from conventional techniques.

Experimental Examples

Experimental examples of the invention are described in the following with particular reference to applications in medical imaging. All examples refer to studies of healthy human subjects.

Figure 6:
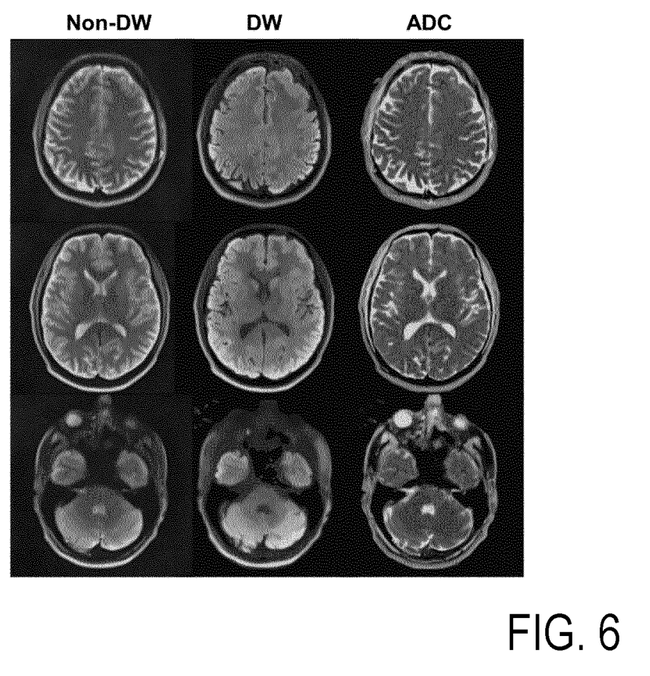
FIGS. 6 and 7: examples of clinically relevant applications of the inventive DW MRI.

An example representing the clinically relevant application of the inventive DW MRI to the brain is shown in FIG. 6. It summarizes three selected cross-sections (top to bottom) of a DW single-shot STEAM MRI study of the normal human brain where images without and with diffusion-weighting (b=0 and 1000 s mm$^{-2}$, 6 diffusion directions) were acquired for a total of 51 directly neighbouring cross-sections in a measurement time of 2 minutes and 30 seconds. The results represent the non-DW image (left), the mean DW image (middle) and the calculated ADC map (right). Regardless of whether the images represent transverse brain sections with little (top row) or strong (bottom row) susceptibility differences, all images are free from inhomogeneity artefacts (i.e., geometric distortions and signal alterations) which are typical for DW EPI measurements.

Figure 7:
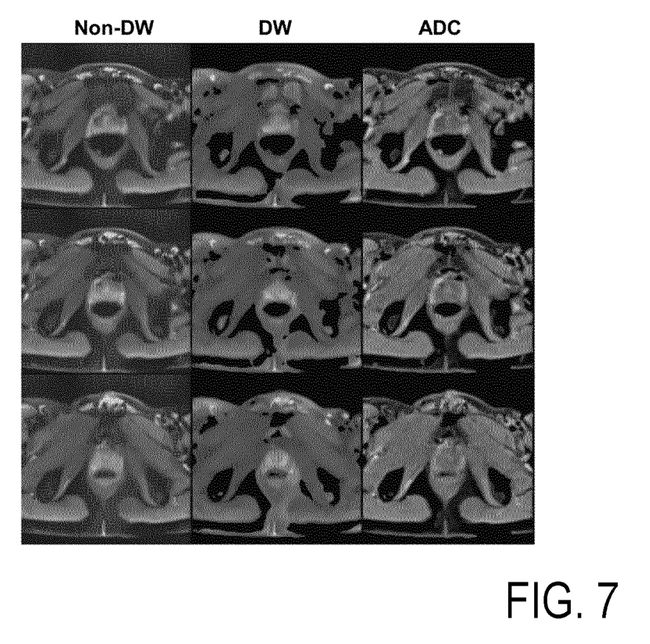

The same finding holds true for abdominal scans. FIG. 7 presents selected results of a DW single-shot STEAM MRI study of the normal human prostate which corresponds to another field of high clinical importance. In this case the non-DW image, the mean DW image (b=0 and 600 s mm$^{-2}$, 6 gradient directions), and the ADC map of the three sections (same organization as in FIG. 6) were selected from a total of 31 directly neighbouring cross-sections acquired in a measurement time of 4 minutes and 30 seconds.

The application of the invention is not restricted to medical imaging, like in the above examples, but correspondingly possible for imaging other objects, like workpieces or other technical objects.

The features of the invention disclosed in the above description, the drawings and the claims can be of significance individually, in combination or sub-combination for the implementation of the invention in its different embodiments.

The invention claimed is:

1. A method for creating multiple sequences of diffusion-weighted magnetic resonance images of an object under investigation, wherein each of said sequences of magnetic resonance images represents a same series of contiguous cross-sectional slices covering a volume of the object under investigation, comprising the steps of:
   (a) providing multiple sequences of sets of image raw data being collected using at least one radiofrequency receiver coil of a magnetic resonance imaging device, wherein
      each set of image raw data includes an image content of one of the magnetic resonance images to be reconstructed,
      each set of image raw data refers to one of the contiguous cross-sectional slices,
      each set of image raw data includes a plurality of data samples being generated with a combined diffusion-weighted spin-echo and single-shot stimulated-echo sequence with diffusion-encoding gradients, said combined sequence spatially encoding a magnetic resonance imaging signal received with the at least one radiofrequency receiver coil using a non-Cartesian k-space trajectory,
      said diffusion-encoding gradients of said multiple sequences of sets of image raw data having at least two different strengths and at least three different directions, wherein one of the sequences of sets of raw data is generated with diffusion-encoding gradients of zero strength or lower strength and further sequences of sets of raw data are generated with diffusion-encoding gradients of higher strength,
      each set of image raw data comprises a set of homogeneously distributed lines in k-space with equivalent spatial frequency content,
      the lines of each set of image raw data cross a center of k-space and cover a continuous range of spatial frequencies,
      a number of lines of each set of image raw data is selected such that each set of image raw data is undersampled below a sampling rate limit defined by the Nyquist-Shannon sampling theorem, and
      positions of the lines of each set of image raw data differ in sets of image raw data from neighboring cross-sectional slices,
   (b) subjecting a sequence of sets of image raw data generated with diffusion-encoding gradients of zero strength or lower strength to a regularized nonlinear inverse reconstruction process to provide a sequence of coil sensitivities and magnetic resonance images with no or lower diffusion weighting, each of the magnetic resonance images representing one of the cross-sectional slices and being created by a simultaneous estimation of a sensitivity of the at least one receiver coil and the image content and in dependency on a difference between a current estimation of the sensitivity of the at least one receiver coil and the image content and an estimation of the sensitivity of the at least one receiver coil and the image content of a neighboring cross-sectional slice, and
   (c) subjecting all sequences of sets of image raw data with diffusion-encoding gradients of zero or lower strength as well as of higher strength to a regularized linear inverse reconstruction process, to provide a sequence of magnetic resonance images with no or lower diffusion weighting and a sequence of magnetic resonance images with higher strength each of the magnetic resonance images representing one of the cross-sectional slices and being created by using the sensitivity of the at least one receiver coil determined in step (b) for the same cross-sectional slice and in dependency on a difference between a current estimation of the image content and an estimation of the image content of a neighboring cross-sectional slice.

2. The method according to claim 1, comprising a further step of (d) subjecting said sequences of magnetic resonance images to a calculation of quantitative maps of the object under investigation, comprising a pixelwise calculation of at least one of
   a mean diffusion-weighted magnetic resonance imaging signal averaged across gradient directions,
   a representation of diffusion properties,
   a diffusion tensor,
   a trace of a diffusion tensor,
   an apparent diffusion coefficient,
   a fractional anisotropy,
   a representation of diffusion directions, and
   a main diffusion direction.

3. The method according to claim 1, wherein the reconstruction process of at least one of steps (b) and (c) includes a filtering process suppressing image artefacts.

4. The method according to claim 3, wherein the filtering process includes applying a spatial filter for each magnetic resonance image.

5. The method according to claim 1, wherein the number of lines of each set of image raw data is selected such that a resulting degree of undersampling is at least a factor of 5.

6. The method according to claim 1, wherein the number of lines of each set of image raw data is at most 30.

7. The method according to claim 1, wherein the lines of each set of image raw data are selected such that the lines of the sets of image raw data of neighboring cross-sectional slices are rotated relative to each other by a predetermined angular displacement.

8. The method according to claim 1, wherein the strength of the diffusion encoding gradients of zero or lower strength is equal to or below a b-value of 100 s $mm^{-2}$.

9. The method according to claim 1, wherein the collection of each set of image raw data is preceded by a radiofrequency pulse and magnetic field gradient module for frequency-selective saturation.

10. The method according to claim 1, wherein the sequences of sets of image raw data are provided by at least one of
   arranging the object in the magnetic resonance imagining device including the at least one receiver coil, subjecting the object to the combined diffusion-weighted spin-echo and single-shot stimulated-echo sequence, and collecting the sequences of sets of image raw data using the at least one receiver coil, and
   receiving the sequences of sets of image raw data by a data transmission collected from a distant magnetic resonance imaging device.

11. A magnetic resonance imaging device being configured for creating a sequence of diffusion-weighted magnetic resonance images of an object under investigation, comprising
- a magnetic resonance imaging scanner including a main magnetic field device, at least one radiofrequency excitation coil, three magnetic field gradient coils and at least one radiofrequency receiver coil, and
- a control device being configured for controlling the magnetic resonance imaging scanner for collecting the multiple sequences of sets of image raw data and reconstructing the sequences of magnetic resonance images with the method according to claim 1.

\* \* \* \* \*